(12) United States Patent
Kwak et al.

(10) Patent No.: US 8,018,142 B2
(45) Date of Patent: Sep. 13, 2011

(54) ORGANIC LIGHT EMITTING DISPLAY AND MOTHER SUBSTRATE THEREOF

(75) Inventors: Won-kyu Kwak, Suwon (KR); Hae-jin Chun, Suwon (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 513 days.

(21) Appl. No.: 12/177,807

(22) Filed: Jul. 22, 2008

(65) Prior Publication Data

US 2009/0045732 A1 Feb. 19, 2009

(30) Foreign Application Priority Data

Aug. 17, 2007 (KR) .................. 10-2007-0082747

(51) Int. Cl.
*H01J 1/62* (2006.01)
*H01J 63/04* (2006.01)
(52) U.S. Cl. ........................ 313/504; 313/512
(58) Field of Classification Search .................. 313/504, 313/512; 257/40; 445/25
See application file for complete search history.

(56) References Cited

U.S. PATENT DOCUMENTS

| | | | |
|---|---|---|---|
| 2003/0017777 A1* | 1/2003 | Matsuoka et al. | 445/24 |
| 2005/0067943 A1 | 3/2005 | Sakaguchi et al. | |
| 2007/0087534 A1* | 4/2007 | Yasukawa | 438/478 |
| 2007/0139312 A1* | 6/2007 | Kwak | 345/76 |
| 2008/0048946 A1* | 2/2008 | Kwak | 345/76 |
| 2008/0054798 A1* | 3/2008 | Jeong et al. | 313/504 |
| 2008/0068309 A1* | 3/2008 | Kwak et al. | 345/82 |
| 2009/0045727 A1* | 2/2009 | Kwak et al. | 313/504 |

FOREIGN PATENT DOCUMENTS

| | | |
|---|---|---|
| JP | 2006-139079 | 6/2006 |
| KR | 2002-0041212 | 6/2002 |
| KR | 2002-0041674 | 6/2002 |
| KR | 10-2005-0104786 | 11/2005 |
| KR | 10-2006-0094324 | 8/2006 |
| KR | 10-2007-0001583 | 1/2007 |
| KR | 10-2007-0032485 | 3/2007 |

OTHER PUBLICATIONS

Patent Abstracts of Japan, Publication 2006-139079, Published Jun. 1, 2006, for Maekawa.
Korean Patent Abstracts, Publication 1020020041212 A, Published Jun. 1, 2002 for Cho, et al.
Korean Patent Abstracts, Publication 1020020041674 A, Published Jun. 3, 2002 for Lim.

(Continued)

*Primary Examiner* — Nimeshkumar Patel
*Assistant Examiner* — Glenn Zimmerman
(74) *Attorney, Agent, or Firm* — Christie, Parker & Hale, LLP

(57) ABSTRACT

A substrate of a plurality of organic light emitting displays. The substrate includes a first wiring line group extending in a first direction to be coupled to organic light emitting displays in a same column among the plurality of organic light emitting displays, and a second wiring line group extending in a second direction to be coupled to organic light emitting displays in the same row among the plurality of organic light emitting displays. The first and second wiring line groups are arranged on the substrate to allow testing of the plurality of organic light emitting displays as a unit sheet.

15 Claims, 5 Drawing Sheets

OTHER PUBLICATIONS

Korean Patent Abstracts, Publication 1020050104786 A, Published Nov. 3, 2005 for Jeoung, et al.
Korean Patent Abstracts, Publication 1020060094324 A, Published Aug. 29, 2006 for Park.
Korean Patent Abstracts, Publication 1020070001583 A, Published Jan. 4, 2007 for Kwak.
Korean Patent Abstracts, Publication 1020070032485 A, Published Mar. 22, 2007 for Kwak, et al.

* cited by examiner

ORGANIC LIGHT EMITTING DISPLAY AND MOTHER SUBSTRATE THEREOF

CROSS-REFERENCE TO RELATED APPLICATION

This application claims priority to and the benefit of Korean Patent Application No. 10-2007-0082747, filed on Aug. 17, 2007, in the Korean Intellectual Property Office, the entire content of which is incorporated herein by reference.

BACKGROUND

1. Field of the Invention

The present invention relates to an organic light emitting display and a mother substrate of the same, and more particularly to, a mother substrate of organic light emitting displays suitably configured to allow effective inspection of a plurality of organic light emitting displays formed on the mother substrate in a unit sheet.

2. Description of the Related Art

In general, a plurality of organic light emitting displays are formed on a mother substrate, and then they are scribed to be divided into individual organic light emitting displays.

The organic light emitting displays are separately inspected by an apparatus for inspecting each organic light emitting display that is scribed.

When circuit wiring lines that constitute the organic light emitting display are changed, or the size of the organic light emitting display is changed, an inspection apparatus must be changed or a jig required for inspection must be changed. In addition, since the organic light emitting displays are separately inspected, it takes a long time to inspect the organic light emitting displays, and the cost increases as the effectiveness of inspection deteriorates.

Therefore, it is desirable to inspect the plurality of organic light emitting displays on the mother substrate in a unit sheet before scribing.

Therefore, it is desirable to provide on the mother substrate wiring lines for supplying various power and signals required for the inspection of the plurality of organic light emitting displays. Furthermore, it is desirable to ensure the stability of the wiring lines to perform effective inspection of the plurality of organic light emitting displays.

SUMMARY OF THE EXEMPLARY EMBODIMENTS

Accordingly, embodiments of the present invention provide a light emitting display capable of securing stability of wiring lines for performing inspection of a unit sheet and of effectively inspecting a plurality of organic light emitting displays formed on a mother substrate in a unit sheet and a mother substrate of the same.

According to an embodiment of the present invention, a substrate including a plurality of organic light emitting displays arranged in a matrix is provided. The substrate includes a first wiring line group and a second wiring line group. The first wiring line group extends in a first direction and is coupled to organic light emitting displays in a same column among the plurality of organic light emitting displays. The second wiring line group extends in a second direction and is coupled to organic light emitting displays in a first row among the plurality of organic light emitting displays. A crossing portion between the second wiring line group coupled to organic light emitting displays in a first row among the plurality of organic light emitting displays and the first wiring line group are within scribing lines of the organic light emitting displays in the first row. At least a portion of the second wiring line group other than the crossing portion is within scribing lines of organic light emitting displays among the organic light emitting displays in a second row adjacent to the first row.

The crossing portion between the first wiring line group and the second wiring line group may be near a first edge of an organic light emitting display coupled thereto, and the first edge is between the organic light emitting displays of the first row and the organic light emitting displays of the second row.

At least a portion of the second wiring line group other than the crossing portion may be located in an organic light emitting display in the second row and is near a first edge of the organic light emitting display. The first edge is between the organic light emitting displays of the first row and the organic light emitting displays of the second row.

Each of the organic light emitting displays may include a first substrate, a second substrate, and a seal. The first substrate includes a display region and a non-display region around the display region. The second substrate is on the first substrate and overlaps a region of the first substrate, and the region includes the display region. The seal attaches the first substrate and the second substrate to each other along edges of the second substrate. The seal does not overlap the crossing portion between the first wiring line group and the second wiring line group.

The first wiring line group and the second wiring line group each may include a plurality of wiring lines for supplying power and/or signals to the plurality of organic light emitting displays.

Electrical coupling points between the first and the second wiring line groups and an organic light emitting display among the plurality of organic light emitting displays may be outside of an area enclosed by the scribing lines associated with the organic light emitting display.

Each of the plurality of organic light emitting displays includes a display region, a scan driver, an inspector, and a data distributor. The display region includes a plurality of pixels coupled to scan lines and data lines. The scan driver supplies scan signals to the scan lines. The inspector is coupled to one end of each of the data lines. The data distributor is coupled to the other end of each of the data lines.

The inspector may be coupled to a plurality of wiring lines of the first wiring line group or the second wiring line group and may include a plurality of transistors coupled between the data lines and the plurality of wiring lines. Gate electrodes of the plurality of transistors may be coupled to one wiring line of the first wiring line group or the second wiring line group and may be configured to such that the plurality of transistors are concurrently turned on.

The data distributor may be configured to be maintained as turned off by a bias signal supplied from a wiring line of the first wiring line group or second wiring line group while an inspection signal is supplied from other wiring lines that belong to the first wiring line group or the second wiring line group to the inspector.

According to another embodiment of the present invention, an organic light emitting display is provided. The organic light emitting display includes a first substrate, a second substrate, and a seal. The first substrate includes a display region having a plurality of pixels at a crossing portion between a plurality of scan lines and a plurality of data lines, and a non-display region around the display region. The second substrate on the first substrate overlaps a region of the first substrate including the display region. The seal attaches the first substrate and the second substrate to each other at edges of the second substrate. The non-display region includes a first wiring group and first bending wiring lines. The first wiring group extends in a first direction near a first edge of the first substrate, and both ends of the first wiring group are floated. The first bending wiring lines extend in a second direction and are near a second edge of the first substrate, and both ends of the first bending wiring lines are floated and bent not to overlap the first wiring line group.

The organic light emitting display may further include second bending wiring lines near a third edge of the first substrate to be bent so as to cross with the first wiring line group, and both ends of the second bending wiring lines are floated.

The crossing portion between the first wiring line group and the second bending wiring lines do not overlap the seal.

The non-display region may include a scan driver, an inspector, a data distributor, and a data driver. The scan driver supplies scan signals to the plurality of scan lines. The inspector is coupled to one end of each of the plurality of data lines. The data distributor is coupled to the other end of each of the plurality of data lines. The data driver supplies a plurality of data signals to the data distributor.

The inspector may include a plurality of transistors each having a first electrode, and the first electrodes of the plurality of transistors are coupled to the data lines.

The plurality of transistors each may have a control electrode, and the control electrodes are coupled together.

The plurality of transistors each may have a second electrode and are divided into at least three groups. The second electrodes of transistors among the plurality of transistors in the same group of the three groups are coupled together.

BRIEF DESCRIPTION OF THE DRAWINGS

These and/or other embodiments and features of the invention will become apparent and more readily appreciated from the following description of certain exemplary embodiments, taken in conjunction with the accompanying drawings of which.

DETAILED DESCRIPTION OF EXEMPLARY EMBODIMENTS

Figure 1:
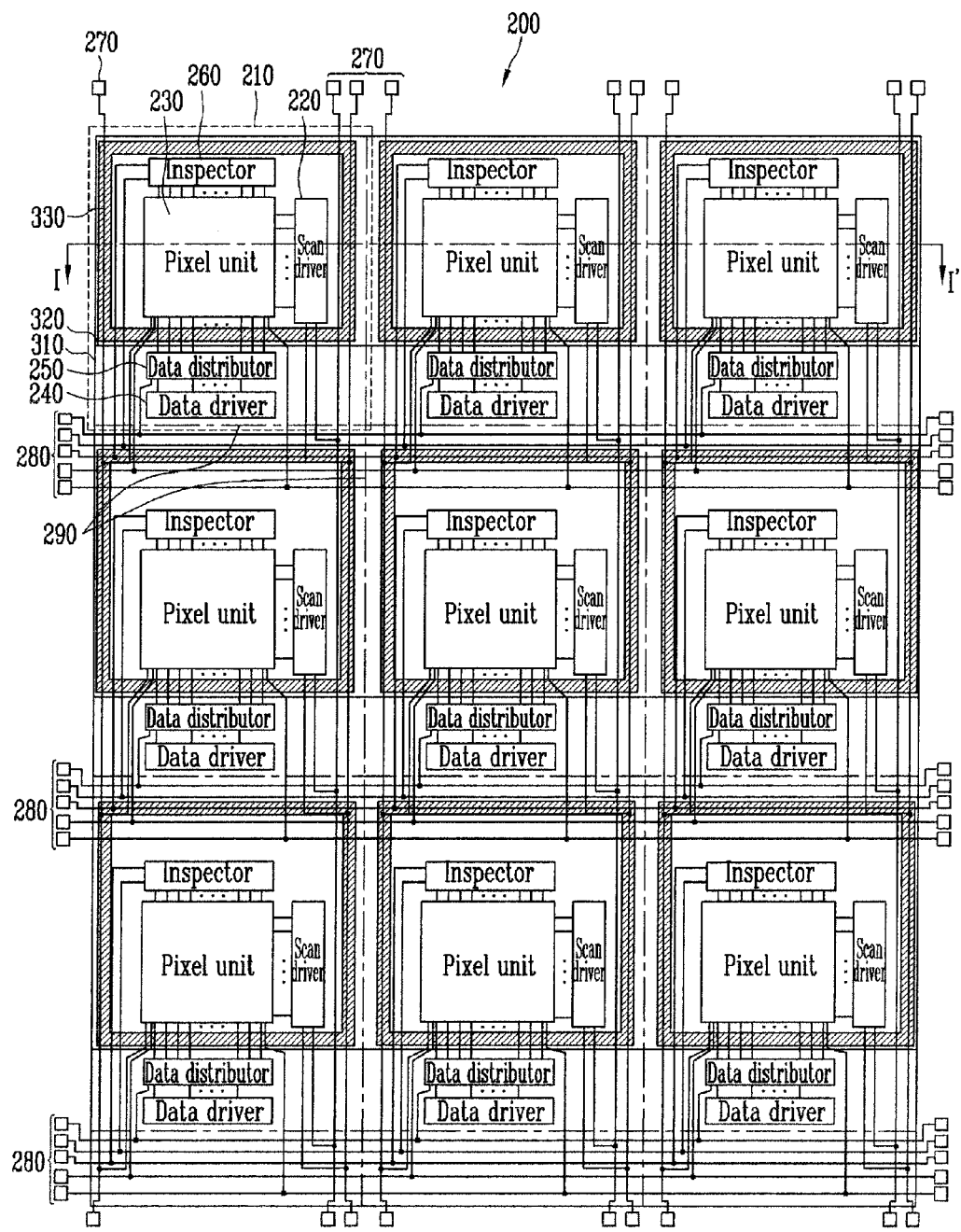
FIG. 1 is a plan view of a mother substrate of organic light emitting displays according to an embodiment of the present invention.

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the invention are omitted for clarity. In addition, like reference numerals refer to like elements throughout.

Figure 2:
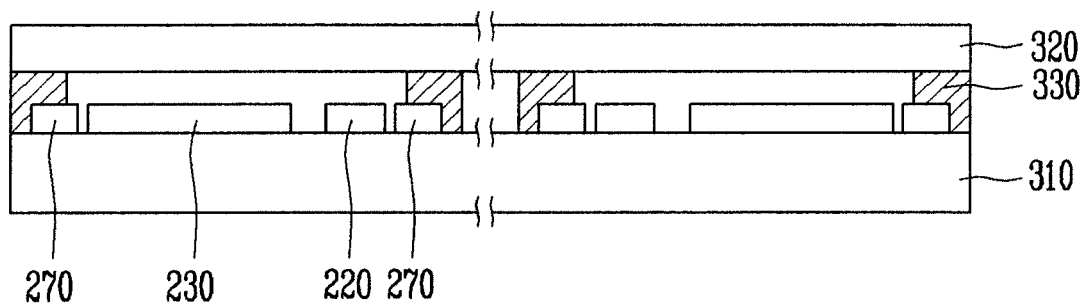
FIG. 2 is a sectional view of the mother substrate taken along the line I-I' of FIG. 1.

FIG. 1 illustrates a mother substrate of organic light emitting displays according to an embodiment of the present invention. FIG. 2 is a sectional view of the mother substrate taken along the line I-I' of FIG. 1.

Referring to FIGS. 1 and 2, a mother substrate 200 of organic light emitting displays according to an embodiment of the present invention includes a plurality of organic light emitting displays 210 arranged in a matrix in a region defined by scribing lines 290, and first and second wiring line groups 270 and 280 respectively extending in first and second directions along the edges between the plurality of organic light emitting displays 210.

Each of the organic light emitting displays 210 includes a scan driver 220, a pixel unit 230 (a.k.a. "display region"), a data driver 240, a data distributor 250, and an inspector 260.

The scan driver 220 is driven by the power and scan control signals supplied from the first wiring line group 270 during the inspection of a unit sheet that is performed on the mother substrate 200 to supply a scan signal to the pixel unit 230. The pixel unit 230 includes a plurality of pixels (not shown) each including an organic light emitting diode (OLED). The pixel unit 230 receives power from the first and second wiring line groups 270 and 280 during the inspection of a unit sheet and receives the scan signal and an inspection signal from the scan driver 220 and the inspector 260, respectively. Driven by the power, the scan signal, and the inspection signal, the pixel unit 230 displays an image to correspond to the power, the scan signal, and the inspection signal.

On the other hand, after the inspection of a unit sheet is completed, and the organic light emitting displays 210 are scribed from the mother substrate 200, the pixel unit 230 displays an image to correspond to the power supplied from a pad (not shown), the scan signal supplied from the scan driver 220, and the data signal supplied from the data distributor 250.

The data driver 240 generates data signals to correspond to data supplied from the outside of the mother substrate 200 after the organic light emitting displays 210 are scribed from the mother substrate 200. The data drivers 240 can be formed on the mother substrate 200 or can be mounted on the organic light emitting displays 210 in the form of circuit chips after scribing.

The data distributor 250 supplies the data signals received from the output lines of the data driver 240 to the three data lines of red, green, and blue sub pixels. The data distributor 250 reduces the required number of channels of the data driver 240 for a high resolution display. By way of example, according to the present embodiment, each pixel included in the pixel unit 230 includes red, green, and blue sub pixels. However, the present invention is not limited to the above example.

On the other hand, the data distributor 250 is configured to be turned off when at least one organic light emitting display 210 is inspected on the mother substrate 200. Therefore, the data distributor 250 receives a bias signal from the second wiring line group 280 during the inspection of a unit sheet. Here, the data driver 240 and the data distributor 250 are formed next to one side of the pixel unit 230 to be coupled to one end of data lines coupled to the pixels of the pixel unit 230.

The inspector 260 supplies red, green, and blue inspection signals to the red, green, and blue sub pixels of the pixel unit 230 (a.k.a. "display region") in response to the inspection control signals supplied during the inspection of a unit sheet. Here, the inspection signals (e.g., red, green, and blue color signals) can be variously set as signals for inspecting picture quality or signals for testing forward/reverse aging. The inspector 260 is formed next to another side of the pixel unit 230 opposite to the side where the data driver 240 and the data distributor 250 are located. The inspector 260 is coupled to the other ends of the data lines.

The first wiring line group 270 extends in a vertical direction (e.g., a first direction) to be commonly coupled to the corresponding organic light emitting displays 210 positioned in the same column on the mother substrate 200.

The second wiring line group 280 extends in a horizontal direction (e.g., a second direction) to be commonly coupled to the corresponding organic light emitting displays 210 positioned in the same row on the mother substrate 200.

The first and second wiring line groups 270 and 280 supply power and signals to at least one of the scan driver 220, the pixel unit 230 (a.k.a. "pixel region"), the data distributor 250, or the inspector 260 formed in the organic light emitting display 210 on which inspection is performed while at least one organic light emitting display 210 is inspected on the mother substrate 200.

Here, electrical coupling points between the first and second wiring line groups 270 and 280 and the organic light emitting displays 210 are positioned at the edges of the scribing lines 290 so that the first and second wiring line groups 270 and 280 and the organic light emitting displays 210 are electrically insulated after scribing.

According to the above-described mother substrate 200 of organic light emitting display according to an embodiment of the present invention, the power and signals required for inspection are supplied to the organic light emitting displays 210 through the first and second wiring line groups 270 and 280 to inspect the plurality of organic light emitting displays 210 in a unit sheet before the organic light emitting displays 210 are scribed.

In other words, the power and signals for inspection are supplied to the first and second wiring line groups 270 and 280 coupled to the plurality of organic light emitting displays 210 so that inspections such as forward/reverse aging and picture quality inspection are performed on the organic light emitting displays 210 that receive the power and signals.

Therefore, inspection time and cost are reduced to improve the efficiency of inspection of the organic light emitting displays 210. Furthermore, even when the circuit wiring lines that constitute the organic light emitting display 210 are changed or the size of the organic light emitting display 210 is changed, as long as the circuit wiring lines of the first and second wiring line groups 270 and 280 and the size of the mother substrate 200 are not changed, inspection can be performed without changing the inspection apparatus or the jig.

In addition, all of the wiring lines that supply the power and the signals for inspection are not arranged in one direction but are arranged in the first and second wiring line groups 270 and 280 that are formed to extend in different directions so that a specific organic light emitting display 210 formed on the mother substrate 200 can be inspected.

For example, the wiring lines that receive power from a first pixel power source (e.g., ELVDD) are arranged in the first wiring line group 270, the wiring lines that receive power from a second pixel power source (e.g., ELVSS) are arranged in the second wiring line group 280, and the power and signals are supplied to the first and second wiring line groups 270 and 280 coupled to the organic light emitting displays 210 so that inspection can be selectively performed on at least one of the organic light emitting displays 210.

That is, according to the mother substrate 200 of organic light emitting displays of the exemplary embodiment, the first and second wiring line groups 270 and 280 are configured to allow the inspection of one or more organic light emitting displays 210 on the mother substrate 200.

On the other hand, the organic light emitting displays formed on the mother substrate 200 are protected against a supporting substrate (e.g., first substrate) 310, a sealing substrate (e.g., second substrate) 320 provided to overlap at least one region of the support substrate 310, and a seal 330 for attaching the supporting substrate 310 and the sealing substrate 320 to each other along the edges of the sealing substrate 320.

In particular, the pixel unit 230 of each of the organic light emitting displays 210 is positioned in a sealing region between the supporting substrate 310 and the sealing substrate 320. Therefore, the OLEDs (not shown) included in the pixels that constitute the pixel unit 230 are protected against oxygen and moisture.

By way of example, in FIG. 2, the first wiring line group 270 that overlaps the seal 330 is illustrated as one wiring line. However, the first wiring line group 270 can include a plurality of wiring lines. In addition, in FIG. 2, the first wiring line group 270 and the seal 330 are in contact with each other. However, at least one insulating layer may be further provided between the first wiring line group 270 and the seal 330.

In the mother substrate 200 of organic light emitting display according to the above-described embodiment, the seal 330 is provided to partially overlap the crossings between the first wiring line group 270 and the second wiring line group 280.

As described above, when the seal 330 is positioned at the crossings between the first wiring line group 270 and the second wiring line group 280, and when a sealing process of attaching the supporting substrate 310 and the sealing substrate 320 to each other is performed, short circuit defect may be generated between some of the wiring lines included in the first and second wiring line groups 270 and 280.

In this case, while the inspection in a unit sheet is performed through the first and second wiring line groups 270 and 280, proper power and/or signals are not supplied to the organic light emitting displays 210 coupled to the first and second wiring line groups 270 and 280 in which short circuit defect is generated so that the inspection in a unit sheet cannot be effectively performed.

Therefore, a method of preventing the short circuit defect from occurring in the first and second wiring line groups 270 and 280 are provided through another embodiment to be described below.

Figure 3:
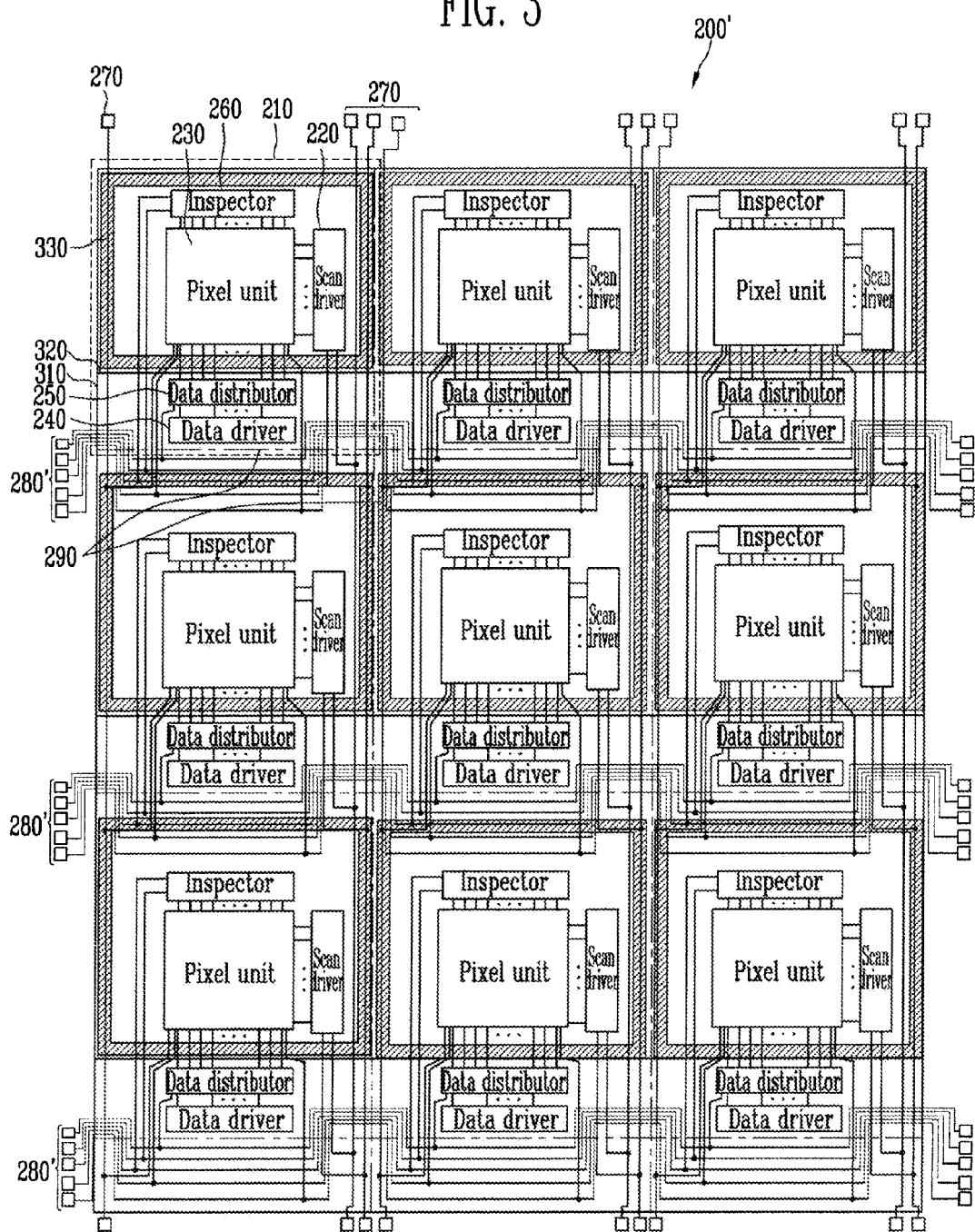
FIG. 3 is a plan view of a mother substrate of organic light emitting displays according to another embodiment of the present invention.
Figure 4:
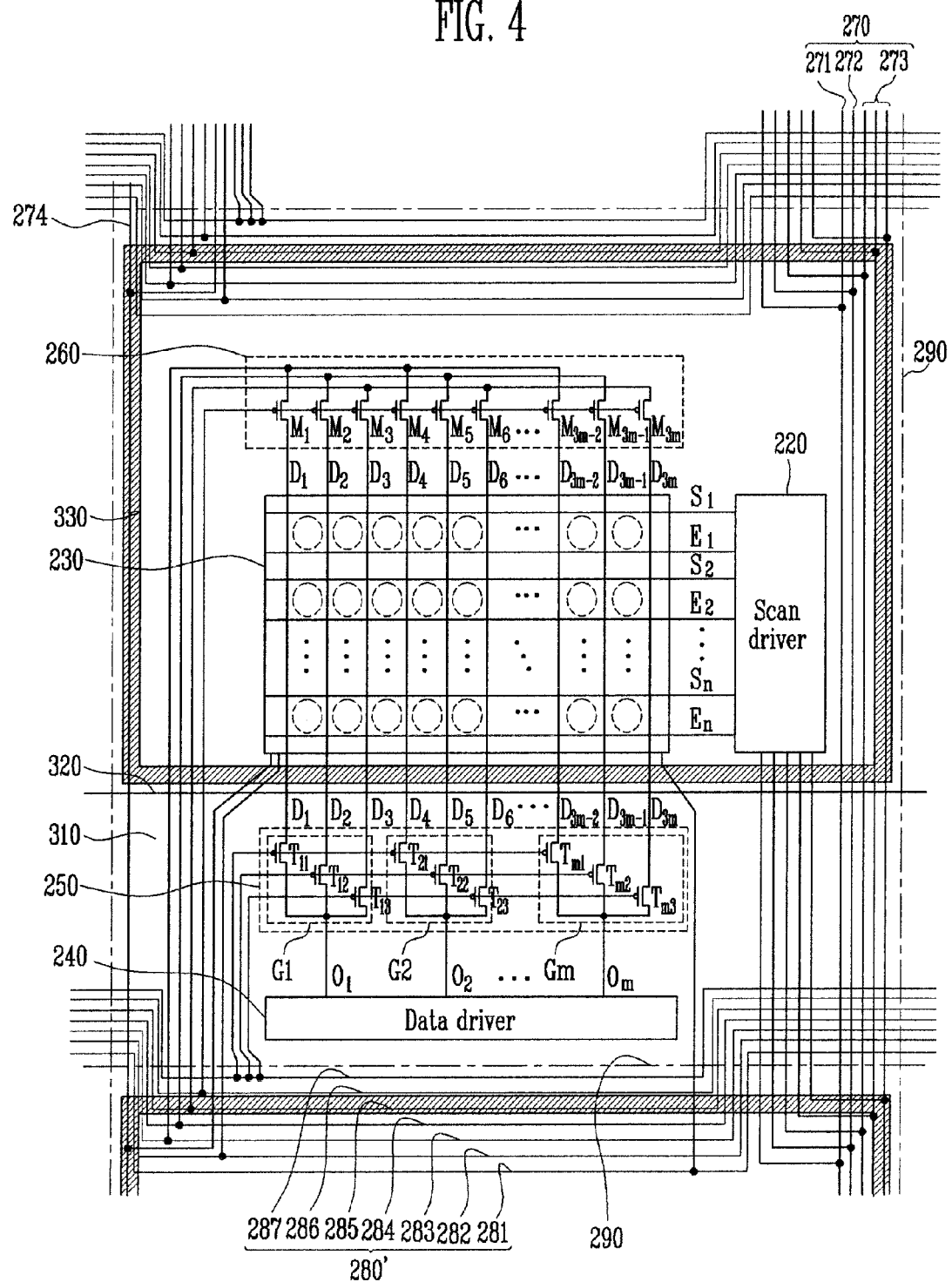
FIG. 4 is a plan view of the structures of an organic light emitting display and wiring groups illustrated in FIG. 3.

FIG. 3 illustrates a mother substrate 200' of organic light emitting displays according to another embodiment of the present invention. FIG. 4 illustrates the structures of an organic light emitting display 210 and wiring groups 270 and 280 illustrated in FIG. 3.

Referring to FIGS. 3 and 4, the same elements as illustrated in FIGS. 1 and 2 are denoted by the same reference numerals, and detailed description thereof will be omitted.

Referring to FIGS. 3 and 4, a mother substrate 200' of organic light emitting displays according to another embodiment of the present invention includes a plurality of organic light emitting displays 210 arranged in a matrix and first and second wiring groups 270 and 280' extending in first and second directions, respectively.

Each of the organic light emitting displays 210 includes a scan driver 220, a pixel unit 230, a data driver 240, a data distributor 250, and an inspector 260.

Here, the data distributor 250 includes a plurality of transistor groups G1 to Gm coupled between data lines ($D_1$, $D_2$, . . . , $D_{3m}$) and output lines ($O_1$, $O_2$, . . . , $O_m$) of the data driver 240 as illustrated in FIG. 4. The transistor groups G1 to Gm respectively include first transistors T11, T21, . . . , and Tm1 coupled to the data lines D1, D4, . . . , D3m-2 of a red sub-pixel, second transistors T12, T22, . . . , and Tm2 coupled to the data lines D2, D5, . . . , and D3m-1 of a green sub-pixel, and third transistors T13, T23, . . . , and Tm3 coupled to the data lines D3, D6, . . . , and D3m of a blue sub-pixel. The first transistors T11, T21, . . . , and Tm1 receive red clock signals from outside of the mother substrate. The second transistors T12, T22, . . . , and Tm2 receive green clock signals. And the third transistors T13, T23, . . . , and Tm3 receive blue clock signals. Hereinafter, the first to third transistors T11 to Tm3 included in the transistor groups G1 to Gm are referred to as distribution transistors.

The distribution transistors T11 to Tm3 supply the data signals received from the output lines O1 to Om of the data driver 240 to the data lines D1 to D3m in response to the red, green, and blue clock signals. Here, the red clock signal, the green clock signal, and the blue clock signal are controlled to display a color image. For example, the red clock signal, the green clock signal, and blue clock signal are supplied at different times to display red, green, and blue images, respectively. In addition, the red clock signal, the green clock signal, and the blue clock signal are concurrently supplied to display a white image.

The data distributor 250 is not used for the inspection of a unit sheet using the first and second wiring line groups 270 and 280'. When the inspection of a unit sheet is performed using the data distributor 250, the data distributor 250 receives the red clock signal, the green clock signal, and the blue clock signal from the first and/or second wiring line groups 270 and 280'.

However, the first and second wiring line groups 270 and 280' extend orthogonally with respect to each other on the mother substrate 200'; therefore, the red clock signal, the green clock signal, and the blue clock signal may experience signal delay when they are passing through the first and second wiring line groups 270 and 280'. As described above, when any of the red clock signal, the green clock signal, and the blue clock signal experiences signal delay, the time required for pixel circuits to be charged with a data voltage is not secured so that a proper image may not be displayed. In addition, it is difficult to synchronize an inspection control signal, an inspection signal, the red clock signal, the green clock signal, and the blue clock signal with each other due to signal delay.

Therefore, according to the exemplary embodiment of the present invention, during the inspection of a unit sheet, the data distributor 250 is set to be turned off and the inspector 260 is additionally provided so that the inspection signal is directly supplied to the pixel unit 230 through the inspector 260 without passing through the data driver 240 and the data distributor 250 during the inspection of a unit sheet.

Therefore, during the inspection of a unit sheet, the data distributor 250 receives a bias signal that turns off the distribution transistors T11 to Tm3 included in the data distributor 250 from a wiring line (e.g., the $17^{th}$ wiring line 287) included in the second wiring line group 280'. That is, during the inspection of a unit sheet, the gate electrodes of the distribution transistors T11 to Tm3 are coupled to the wiring line (e.g., the $17^{th}$ wiring line 287) to receive the bias signal from the $17^{th}$ wiring line 287. The distribution transistors T11 to Tm3 that receive the bias signal are turned off. Here, the distribution transistors T11 and Tm3 of the data distributor 250 and the transistors M1 to M3m included in the inspector 260 are coupled to the opposite ends of the data lines D1 to D3m, respectively. For example, when the distribution transistors T11 to Tm3 of the data distributor 250 are respectively connected to one end of each of the data lines D1 to D3m, the transistors M1 to M3m included in the inspector 260 are respectively coupled to the other ends of the data lines D1 to D3m. The inspector 260 includes the plurality of transistors M1 to M3m whose gate electrodes are commonly coupled to a wiring line (e.g., the $16^{th}$ wiring line 286) included in the second wiring line group 280' for the inspection of a unit sheet as illustrated in FIG. 4.

By way of example, the source electrode of each of the transistors M1 to M3m are coupled to one of the $13^{th}$ to $15^{th}$ wiring lines 283 to 285, and the drain electrodes of the transistors M1 to M3m are respectively coupled to the data lines D1 to D3m. Here, the transistors M1, M4, . . . , and M3m-2 coupled to the $13^{th}$ wiring line 283 are respectively coupled to the data lines D1, D4, . . . , and D3m-2 of the red sub-pixels. The transistors M2, M5, . . . , and M3m-1 coupled to the $14^{th}$ wiring line 284 are respectively coupled to the data lines D2, D5, . . . , and D3m-1 of the green sub-pixel. The transistors M3, M6, . . . , and M3m coupled to the fifth wiring line 285 are respectively coupled to the data lines D3, D6, . . . , and D3m of the blue sub-pixel.

The transistors M1 to M3m included in the inspector 260 are concurrently turned on in response to the inspection control signal supplied from the $16^{th}$ wiring line 286 during the inspection of a unit sheet to supply the inspection signals supplied from the $13^{th}$ to $15^{th}$ wiring lines 283 to 285 to the data lines D1 to D3m.

Here, the inspection signals, that is, the red, green, and blue inspection signals, supplied from the $13^{th}$ to $15^{th}$ wiring lines 283 to 285 to the data lines D1 to D3m via the inspector 260 can be supplied at different times in order to display different color images and can be concurrently supplied. That is, according to the present embodiment, when the inspection control signal is supplied to the inspector 260 through the $16^{th}$ wiring line 286, the color image displayed corresponds to the timings of the red, green, and blue inspection signals supplied to the $13^{th}$ to $15^{th}$ wiring lines 283 to 285 so that the inspection is performed.

The inspector 260 is provided above the pixel unit 230 on opposite side to the data driver 240 and the data distributor 250 with respect to the pixel unit 230 and to be coupled to the other ends of the data lines (D1 to D3m).

On the other hand, the above-described inspector 260 remains turned off in response to the control signal supplied from the outside of the organic light emitting display 210 when the inspection is completed. That is, the inspector 260 as a transistor group is maintained to be turned off when the organic light emitting displays 210 are normally operated after being scribed from the mother substrate 200'.

The first wiring line group 270 extends in the region between the organic light emitting displays 210 in a first direction (e.g., vertical direction) to be commonly coupled to the corresponding organic light emitting displays 210 positioned in a same column of the mother substrate 200'.

The first wiring group 270 includes a first wiring line 271 that receives power from a first scan driving power source (e.g., VDD), a second wiring line 272 that receives power from a second scan driving power source (e.g., VSS), third wiring lines 273 that receive scan control signals, and a fourth wiring line 274 that receives power from a first pixel power source (e.g., ELVDD).

The first wiring line 271 supplies power from the first scan driving power source during the inspection of a unit sheet to the scan driver 220 included in each of the organic light emitting displays 210.

The second wiring line 272 supplies power from the second scan driving power source (e.g., VSS) during the inspection of a unit sheet to the scan driver included in each of the organic light emitting displays 210.

The third wiring lines 273 supply the scan control signals supplied during the inspection of a unit sheet to the scan driver 220 included in each of the organic light emitting displays 210. The scan control signals include the clock signal, the output enable signal, and the start pulse of the scan driver 220. In some embodiments, the number of scan control signals supplied to the scan driver 220 varies with the circuit structure of the scan driver 220. Therefore, the number of third wiring lines 273 is determined by the circuit structure of the scan driver 220. In this exemplary embodiment, it is assumed that three wiring lines are included in the third wiring lines 273.

The fourth wiring line 274 supplies power from the first pixel power source ELVDD during the inspection of a unit sheet to the pixel unit 230 included in each of the organic light emitting displays 210.

The second wiring line group 280' extends in the region between the organic light emitting displays 210 in a second direction (e.g., a horizontal direction) to be commonly coupled to the corresponding organic light emitting displays 210 positioned in a same row of the mother substrate 200'.

In this exemplary embodiment, the second wiring line group 280' includes an $11^{th}$ wiring line 281 that receives power from the second pixel power source ELVSS, a $12^{th}$ wiring line 282 that receives power from an initiation power source Vinit, a $13^{th}$ wiring line 283 that receives a red inspection signal, a $14^{th}$ wiring line 284 that receives a green inspection signal, a $15^{th}$ wiring line 285 that receives a blue inspection signal, a $16^{th}$ wiring line 286 that receives an inspection control signal, and a $17^{th}$ wiring line 287 that receives a bias signal.

The $11^{th}$ wiring line 281 supplies power from the second pixel power source ELVSS during the inspection of a unit sheet to the pixel unit 230 included in each of the organic light emitting displays 210.

The $12^{th}$ wiring line 282 supplies power from the initiation power source Vinit during the inspection of a unit sheet to the pixel unit 230 included in each of the organic light emitting displays 210.

The $13^{th}$ wiring line 283 supplies the red inspection signal during the inspection of a unit sheet to the inspector 260 included in each of the organic light emitting displays 210.

The $14^{th}$ wiring line 284 supplies the green inspection signal during the inspection of a unit sheet to the inspector 260 included in each of the organic light emitting displays 210.

The $15^{th}$ wiring line 285 supplies the blue inspection signal during the inspection of a unit sheet to the inspector 260 included in each of the organic light emitting displays 210.

The $16^{th}$ wiring line 286 supplies the inspection control signal during the inspection of a unit sheet to the inspector 260 included in each of the organic light emitting displays 210.

The $17^{th}$ wiring line 287 supplies the bias signal during the inspection of a unit sheet to the data distributor 250 included in each of the organic light emitting displays 210.

Here, a part of the second wiring group 280' that intersect the first wiring line group 270 is bended in the direction of an upper row. Therefore, the intersection part between the first and second wiring line groups 270 and 280' is positioned in the upper row of the organic light emitting displays 210 where the second wiring line group 280' is positioned, that is, below the organic light emitting display 210 coupled to the second wiring line group 280'.

The crossed-over part between the second wiring line group 280' and the first wiring line group 270 coupled to the organic light emitting displays 210 positioned in an $i^{th}$ (i is a natural number) row among the organic light emitting displays 210 formed on the mother substrate 200' is positioned within an area enclosed by the scribing lines 290 of the organic light emitting displays 210 positioned in the $i^{th}$ row.

Most parts of the second wiring line group 280' region other than the crossed-over parts are positioned on the organic light emitting displays 210 in a lower row that are not coupled thereto. The coupling points between the first and second wiring line groups 270 and 280' and the organic light emitting displays 210 are positioned outside the scribing lines 290 so that the first and second wiring line groups 270 and 280' and the organic light emitting displays 210 are insulated from each other after scribing.

That is, most parts other than the crossed-over parts of the second wiring line group 280' coupled to the $i^{th}$ row organic light emitting displays 210 are positioned within the scribing lines 290 of the $(i+1)^{th}$ organic light emitting displays 210.

As described above, a part of the second wiring line group 280' that crosses over with the first wiring line group 270 is bent so that the crossed-over part between the first and second wiring line groups 270 and 280' does not overlap the seal 330.

Therefore, it is possible to prevent the wiring lines included in the first and second wiring groups 270 and 280' from being shorted by the external force applied during the sealing process of attaching the supporting substrate 310 and the sealing substrate 320 to each other. That is, the stability of the wiring lines included in the first and second wiring groups 270 and 280' is improved.

Therefore, during the inspection of a unit sheet, the power sources and/or signals are smoothly supplied to the organic light emitting displays 210 so that the inspection of a unit sheet is effectively performed.

In addition, according to the present embodiment, during the inspection of a unit sheet, in a state where the distributor 250 is maintained to be turned off, the red, blue, and green inspection signals are supplied to the pixel unit 230 through the inspector 260 so that it is possible to solve problems caused by the signal delay that can be generated during the inspection performed using the data distributor 250.

For example, during the inspection of a unit sheet, in a state where the plurality of transistors M1 to M3$m$ included in the inspector 260 are turned on, the red, blue, and green inspection signals are supplied so that it is possible to solve problems caused by not providing enough time for the pixel circuit 230 to be charged with the data voltage. In addition, since the inspection is performed without passing signals through the data distributor 250, it is not necessary to synchronize the inspection control signal and the inspection signal, the red clock signal, the green clock signal, and the blue clock signal so that difficulties in signal synchronization are removed. In the above embodiment, for convenience sake, the first to fourth wiring groups 271 to 274 and the $11^{th}$ to $17^{th}$ wiring lines 281 to 287 are included in one wiring line group in the first and second wiring line group 270 and 280, respectively. However, the present invention is not limited to the above. For example, in some embodiments, the first wiring line 271 that supplies power from the first pixel power source ELVDD can be included in both the first and second wiring line groups 270 and 280'. or it can be included in either the first or second wiring line group 270 or 280'.

Figure 5:
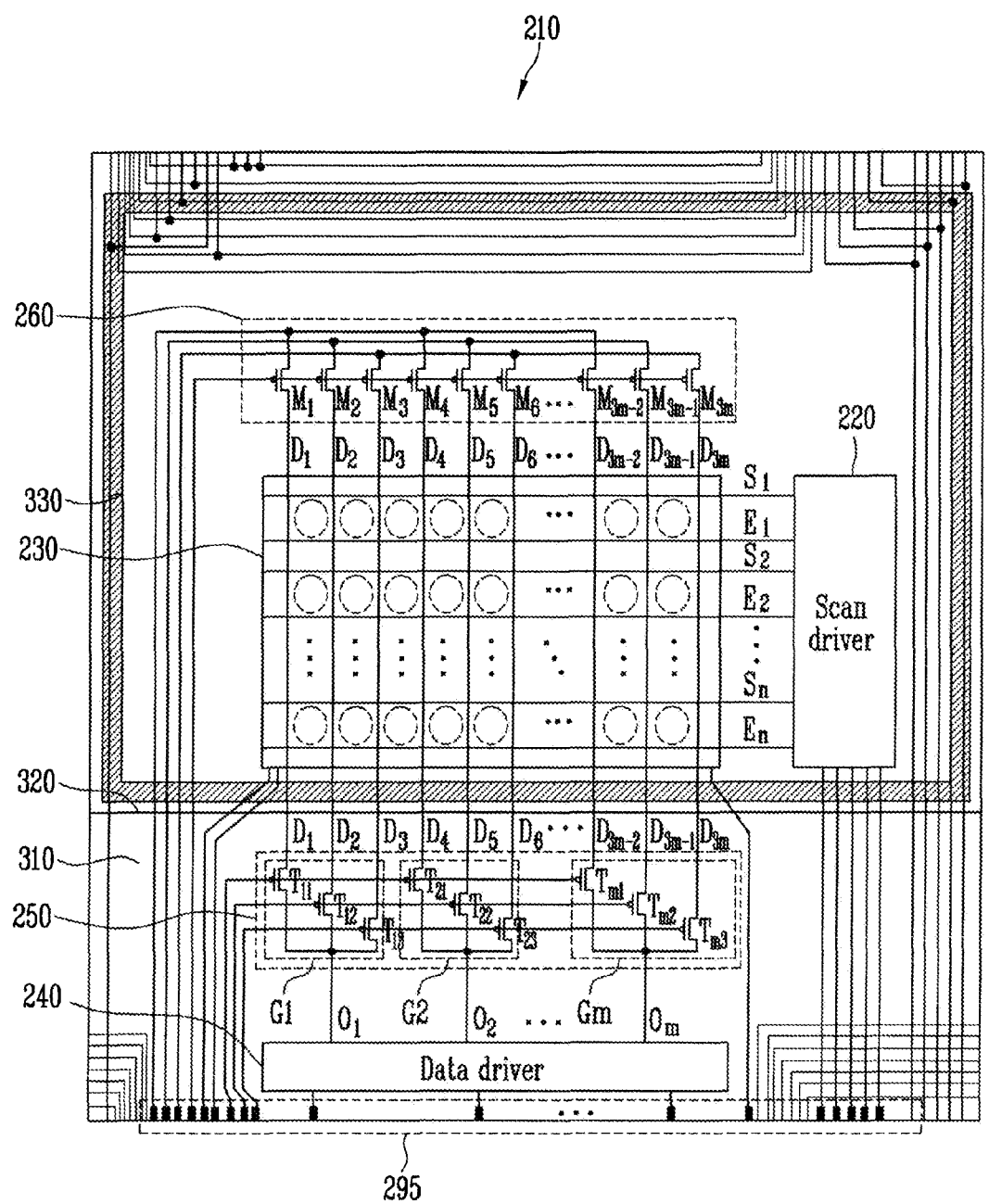
FIG. 5 is a plan view of the organic light emitting display after scribing the mother substrate of the organic light emitting display illustrated in FIGS. 3 and 4.

FIG. 5 illustrates an organic light emitting display 210 after scribing the organic light emitting display 210 illustrated in FIGS. 3 and 4. In FIG. 5, the same elements as shown in FIGS.

3 and 4 are denoted by the same reference numerals and detailed description thereof will be omitted.

Referring to FIG. 5, the scribed organic light emitting display 210 includes a supporting substrate (e.g., a first substrate) 310 including a pixel unit 230 (a.k.a. "display region"), a scan driver 220 formed (or mounted) in the non-pixel region (a.k.a. "non-display region") peripheral to or surrounding the pixel unit 230, a data driver 240, a data distributor 250, and an inspector 260, a sealing substrate (e.g., a second substrate) 320 provided on the supporting substrate 310 to overlap at least the pixel unit 230, and a seal 330 applied along the edges of the sealing substrate 320 that faces the supporting substrate 310 to attach the supporting substrate 310 and the sealing substrate 320 to each other.

Here, the inspection unit 260 is maintained to be turned off by the bias signal supplied through a pad 295. The scan driver 220, the pixel unit 230, the data driver 240, and the data distributor 250 are driven by the power sources and/or signals supplied from the outside through the pad 295.

Around the edges of the non-pixel region (a.k.a. "non-display region") of the organic light emitting display 210 shown in FIG. 5, the first wiring line group extends in the first direction (e.g., vertical direction) with both ends of the first wiring line group being floated (i.e., not driven by a signal/power). First bending wiring lines formed above the pixel unit 230 are extending in the second direction (e.g., horizontal direction) with both ends of the first bending wiring lines being floated. The first bending wiring lines are bent at both ends in the direction of the upper edge so that its both ends do not overlap the first wiring line group. Second bending wiring lines with both ends floated are formed at the lower edge to cross over with the first wiring line group. The second bending wiring lines are bent in the direction of the lower edge. Here, the first wiring line group of the organic light emitting display 210 of FIG. 5 is a part of the first wiring line group 270 of the mother substrate 200' (shown in FIG. 3) positioned near one of the scribing lines 290 of the organic light emitting display 210. The first and second bending wiring lines are part of the second wiring line group 280' of the mother substrate 200' positioned near one of the scribing lines 290 of the organic light emitting display 210.

The first wiring line group and the first and second bending wiring lines of the organic light emitting display 210 are electrically insulated from the other elements so that the first wiring line group and the first and second bending wiring lines of the organic light emitting display 210 do not participate in the driving of the organic light emitting display 210.

Although certain exemplary embodiments of the present invention have been shown and described, it would be appreciated by those skilled in the art that changes might be made in this embodiment without departing from the principles and spirit of the invention, the scope of which is defined in the claims and their equivalents.

What is claimed is:

1. A substrate of organic light emitting display comprising a plurality of organic light emitting displays arranged in a matrix, the substrate comprising:
    a first wiring line group extending in a first direction and coupled to organic light emitting displays in a same column among the plurality of organic light emitting displays; and
    a second wiring line group extending in a second direction and coupled to organic light emitting displays in a first row among the plurality of organic light emitting displays,
    wherein a crossing portion between the second wiring line group coupled to organic light emitting displays in the first row and the first wiring line group is within scribing lines of the organic light emitting displays in the first row, and
    wherein at least a portion of the second wiring line group other than the crossing portion is within scribing lines of organic light emitting displays among the organic light emitting displays in a second row adjacent to the first row.

2. The substrate as claimed in claim 1, wherein the crossing portion between the first wiring line group and the second wiring line group is near a first edge of an organic light emitting display coupled thereto, and
    wherein the first edge is between the organic light emitting displays of the first row and the organic light emitting displays of the second row.

3. The substrate as claimed in claim 1, wherein at least a portion of the second wiring line group other than the crossing portion is located in an organic light emitting display in the second row and is near a first edge of the organic light emitting displays, and
    wherein the first edge is between the organic light emitting displays of the first row and the organic light emitting displays of the second row.

4. The substrate as claimed in claim 1, wherein each of the organic light emitting displays comprises:
    a first substrate comprising a display region and a non-display region around the display region;
    a second substrate on the first substrate and overlapping a region of the first substrate, the region comprising the display region; and
    a seal for attaching the first substrate and the second substrate to each other along edges of the second substrate,
    wherein the seal does not overlap the crossing portion between the first wiring line group and the second wiring line group.

5. The substrate as claimed in claim 1, wherein the first wiring line group and the second wiring line group each comprise a plurality of wiring lines for supplying power and/or signals to the plurality of organic light emitting displays.

6. The substrate as claimed in claim 1, wherein electrical coupling points between the first and second wiring line groups and an organic light emitting display among the plurality of organic light emitting displays are outside of an area enclosed by the scribing lines associated with the organic light emitting display.

7. The substrate as claimed in claim 1, wherein each of the plurality of organic light emitting displays comprises:
    a display region comprising a plurality of pixels coupled to scan lines and data lines;
    a scan driver for supplying scan signals to the scan lines;
    an inspector coupled to one end of each of the data lines; and
    a data distributor coupled to the other end of each of the data lines.

8. The substrate as claimed in claim 7,
    wherein the inspector is coupled to a plurality of wiring lines of the first wiring line group or the second wiring line group and comprises a plurality of transistors coupled between the data lines and the plurality of wiring lines, and
    wherein gate electrodes of the plurality of transistors are coupled to one wiring line of the first wiring line group or the second wiring line group and are configured such that the plurality of transistors are concurrently turned on.

9. The substrate as claimed in claim 7, wherein the data distributor is configured to be maintained as turned off by a bias signal supplied from a wiring line of the first wiring line group or the second wiring line group while an inspection signal is supplied from other wiring lines that belong to the first wiring line group or the second wiring line group to the inspector.

10. An organic light emitting display, comprising:
a first substrate comprising a display region having a plurality of pixels at a crossing portion between a plurality of scan lines and a plurality of data lines, and a non-display region around the display region;
a second substrate on the first substrate overlapping a region of the first substrate comprising the display region; and
a seal for attaching the first substrate and the second substrate to each other at edges of the second substrate,
wherein the non-display region comprises:
   a first wiring line group extending in a first direction near a first edge of the first substrate, both ends of the first wiring line group being floated;
   first bending wiring lines extending in a second direction and being near a second edge of the first substrate, both ends of the first bending wiring lines being floated and bent not to overlap the first wiring line group; and
   second bending wiring lines near a third edge of the first substrate to be bent so as to cross with the first wiring line group, both ends of the second bending wiring lines being floated,
wherein the first wiring line group and the first bending wiring lines are electrically isolated from other elements of the organic light emitting display.

11. The organic light emitting display as claimed in claim 10, wherein a crossing portion between the first wiring line group and the second bending wiring lines does not overlap the seal.

12. The organic light emitting display as claimed in claim 10, wherein the non-display region comprises:
   a scan driver for supplying scan signals to the plurality of scan lines;
   an inspector coupled to one end of each of the plurality of data lines;
   a data distributor coupled to the other end of each of the plurality of data lines; and
   a data driver for supplying a plurality of data signals to the data distributor.

13. The organic light emitting display as claimed in claim 12,
   wherein the inspector comprises a plurality of transistors each having a first electrode, and
   wherein the first electrodes of the plurality of transistors are coupled to the data lines.

14. The organic light emitting display as claimed in claim 13,
   wherein the plurality of transistors each have a control electrode, and
   wherein the control electrodes are coupled together.

15. The organic light emitting display as claimed in claim 13,
   wherein the plurality of transistors each having a second electrode are divided into at least three groups, and
   wherein the second electrodes of transistors among the plurality of transistors in the same group of the three groups are coupled together.

* * * * *